United States Patent
Eschbaumer et al.

(10) Patent No.: US 7,041,426 B2
(45) Date of Patent: May 9, 2006

(54) PHOTORESIST BASED ON POLYCONDENSATES AND HAVING AN INCREASED RESOLUTION FOR USE IN 157 NANOMETER LITHOGRAPHY

(75) Inventors: Christian Eschbaumer, Schwaig (DE); Christoph Hohle, Bubenreuth (DE); Michael Sebald, Weisendorf (DE); Jörg Rottstegge, Erlangen (DE)

(73) Assignee: Infineon Technologies AG, Munich (DE)

(*) Notice: Subject to any disclaimer, the term of this patent is extended or adjusted under 35 U.S.C. 154(b) by 256 days.

(21) Appl. No.: 10/199,640

(22) Filed: Jul. 19, 2002

(65) Prior Publication Data

US 2003/0082480 A1 May 1, 2003

(30) Foreign Application Priority Data

Jul. 19, 2001 (DE) ................. 101 35 246

(51) Int. Cl.
*G03C 1/73* (2006.01)
*G03F 7/039* (2006.01)

(52) U.S. Cl. .................. 430/270.1; 430/905; 430/907; 430/906; 430/908; 430/325; 430/326; 430/914

(58) Field of Classification Search .............. 430/270.1, 430/325, 326, 914, 905, 907, 906, 908
See application file for complete search history.

(56) References Cited

U.S. PATENT DOCUMENTS 4,663,269 A * 5/1987 Narang et al. .............. 430/326
5,453,341 A * 9/1995 Schwalm ..................... 430/18

FOREIGN PATENT DOCUMENTS

DE 39 14 407 A1 10/1990
EP 1 089 129 A1 4/2001

OTHER PUBLICATIONS

Reddy et al. ("Hexafluoroisopropoxy-containing Polyesters", Polymer, vol. 37, No. 21, pp. 4873-4875.*

* cited by examiner

*Primary Examiner*—Sin Lee
(74) *Attorney, Agent, or Firm*—Laurence A. Greenberg; Werner H. Stemer; Ralph E. Locher

(57) ABSTRACT

A photoresist includes a polymer which has acid-cleavable groups in its main chain. The polymer can thus be cleaved by acid into short cleavage products which can be removed from the substrate through the use of a developer. The polymer is completely or partially fluorinated, and consequently has an improved transparency to light of short wavelengths.

16 Claims, No Drawings

PHOTORESIST BASED ON POLYCONDENSATES AND HAVING AN INCREASED RESOLUTION FOR USE IN 157 NANOMETER LITHOGRAPHY

BACKGROUND OF THE INVENTION

Field of the Invention

The invention relates to a photoresist which makes it possible to produce structures with photolithographic methods having a high resolution.

Thin layers of photoresists are used for structuring semiconductor substrates during the production of microchips. The photoresists can be selectively changed in their chemical nature by an exposure with a photo mask or by a direct exposure, for example by an exposure with an electron beam. After a development step in which the exposed parts of the photoresist are removed, a structured photoresist is obtained and is used as a mask, for example for etching the semiconductor substrate. A number of processes have already been developed for the production of structured resists, wherein two basic groups are distinguished.

In the case of positive photoresists, the exposed parts are removed in the development step and form trenches in the structured photoresist while the unexposed parts remain on the substrate and form the lands or webs of the structured resist. In the case of negative resists, in contrast to the positive-working resists, the exposed part of the resist remains on the substrate while the unexposed part is removed by the developer solution. The difference between the solubility of exposed and unexposed photoresists can be achieved, for example, by initiating, with an exposure, a chemical reaction in the negative photoresist such that the photoresist is crosslinked and thus becomes insoluble.

In order to achieve a high quantum yield and an adequate process speed, as a rule chemically amplified resist materials are used. A photo acid generator or a photo base generator which exhibits a high quantum yield at the exposure wavelength has been added to the resist materials. In the case of positive-working photoresists, the polymer of the photoresist has, for example, acid-labile groups. The exposure liberates a very strong acid, through the use of which the acid-labile groups are catalytically eliminated in a baking step. Through the elimination of the acid-labile group, a polar group is liberated, for example a carboxyl group or a hydroxyl group, with the result that the polarity of the polymer is increased and the latter becomes soluble in aqueous alkaline developers. After the development, the structures produced are transferred to the substrate by etching processes. In the case of dry etching, the etching process is generally carried out using a fluorine or oxygen plasma. In order to be able selectively to etch only the bare parts of the substrate, the structured resist must have sufficient resistance to the plasma used. The structured resist must therefore either have a sufficiently large layer thickness or groups which increase the etching resistance of the polymer are provided in the polymer. When an oxygen-containing etching plasma is used, the photoresist generally contains silicon-containing groups. These are converted during the etching process into silicon dioxide, which forms a protective layer stable to etching on the photoresist. In the case of a fluorine plasma, the use of silicon-containing polymers is not expedient since the silicon is converted into volatile silicon tetrafluoride under the action of the fluorine plasma. In this case, polymers which have a high content of aromatic or alicyclic groups are therefore used.

The advances made in semiconductor technology require the resolution of smaller and smaller structures. In order to overcome the limits set by the resolution of the photolithography techniques customary at present, attempts are being made to use radiation of increasingly short wavelengths for exposure of the photoresist. Fluorine lasers which emit light having a wavelength of 157 nm are favored as the most promising light source. However, the currently used resist materials, which are exposed to light having a wavelength of 248 or 193 nm, do not have sufficient transparency at a wavelength of 157 nm. In order to ensure that sufficient quantities of light penetrate even into the deep layers of the photoresist, only extremely thin layers can therefore be used. In order to achieve sufficient etching resistance, the structured resist must therefore be chemically amplified in a separate step after the development. The chemical amplification introduces into the polymer groups which increase the etching resistance of the resist.

In addition to sufficient transparency, the polymer must also have adequate film formation properties, a sufficiently high softening temperature and sufficient adhesion to the substrate. In order to attain these properties, it is necessary to use high molecular weight polymers. The polymers used for photoresists have to date generally been produced by free radical polymerization and therefore have a backbone of carbon atoms. If a polymer molecule is arranged in such a way that it extends across the boundary line between exposed and unexposed parts of the photoresist, the acid-labile groups are eliminated only in the exposed segment of the polymer molecule on exposure and baking. Consequently, the polarity of the total polymer chain changes only gradually, so that the total polymer chain is removed from the surface of the substrate from a certain threshold value in the change of the polarity of the polymer in the developing step. This causes poorly defined lines in the structure produced by exposure. With decreasing dimensions of the structures produced, difficulties with the resolution of the structure are therefore encountered. The line edge roughness should not exceed a value of about 5 nm. However, the dimensions of the currently used polymers exceeds this value by far. In order to improve the resolution, it is therefore necessary to use shorter polymer chains in classical resists. However, this causes a deterioration in the further material properties, such as film formation or glass transition temperature.

In order to reduce the line edge roughness, it has been proposed to provide acid-labile groups in the main chain of the polymer. In the baking step following the exposure, the acid-labile groups are cleaved. This leads to depolymerization of the polymer main chain in the exposed parts, with the result that fragments of the polymer are produced. Small molecules having completely different properties, for example with respect to polarity, molecular weight or solubility, are thus produced. Although the line edge roughness can be reduced by using these polymers, the photoresists still have insufficient transparency at short wavelengths.

SUMMARY OF THE INVENTION

It is accordingly an object of the invention to provide a photoresist which overcomes the above-mentioned disadvantages of the heretofore-known photoresists of this general type and which has a high transparency to light of short wavelengths, in particular a wavelength of 157 nm, and which allows to produce structures in an exposure step that have well defined lines.

With the foregoing and other objects in view there is provided, in accordance with the invention, a photoresist including:

a polymer which is obtained by polycondensation of at least one monomer and which has acid-cleavable groups in its main chain, at least one of the monomers having one or more fluorine or fluoroalkyl groups;

a photo acid generator; and a solvent.

In contrast to the polymers used to date for photoresists and having a backbone of carbon atoms, the photoresist according to the invention includes a polymer which contains acid-cleavable groups in its main chain which forms the backbone of the polymer. It is therefore possible to use high molecular weight polymers which have good film formation properties, good adhesion to the substrate and a sufficiently high glass transition temperature. Since the polymer is cleaved by the acid liberated from the photo acid generator during exposure, smaller fragments are formed which can then be removed from the developer or removed in a dry development step. In contrast to the polymers used to date, no partly modified polymer chains are therefore developed away from the partially exposed parts, but only the polymer fragments in the exposed parts. This permits a substantial reduction in the line edge roughness and hence the production of smaller structures by exposure. Difficulties caused by the low transparency of the known polymers at short wavelengths are overcome by at least partial fluorination of the polymer. The polymer is therefore prepared in a condensation reaction from at least one monomer which is at least partly fluorinated. After at least one of the monomers has been completely or partly fluorinated, the polymer has sufficient transparency even to light of short wavelength. The layer thicknesses of the photoresist of up to 200 nm are thus possible.

The photo acid generators customary for photoresists can be used as photo acid generators. Onium compounds, as described, for example, in Published European Patent Application No. EP 0 955 562 A1, are preferably used.

All customary solvents or mixtures thereof which are capable of taking up the components of the photoresist in a clear, homogeneous solution having a long shelf life and which ensure a good layer quality during coating of the substrate can be used as solvents.

The photoresist is applied to the substrate by customary methods, for example by spin-coating, spraying on or immersion methods. The solvent is, then removed by customary methods. For this purpose, the substrate with the resist film is generally heated.

If the polymer obtained by polycondensation is prepared from only a single monomer, the monomer must be at least bifunctional, i.e. must have at least one nucleophilic substituent and at least one activated substituent, so that a bond is formed by a nucleophilic attack with condensation.

Suitable monomers are, for example, selected from a group including aromatic, aliphatic and cycloaliphatic hydroxycarboxylic acids and their activated derivatives, hydroxyl-substituted isocyanates and activated hydroxyl-substituted carbonic acid derivatives.

According to a particularly preferred embodiment, the polymer is prepared from at least a first and a second monomer. In this case, monomers which carry only nucleophilic or only activated substituents can be used. The first monomer may then include, for example, at least two nucleophilic substituents and the second monomer at least two activated substituents which can be subjected to nucleophilic attack.

The first monomer which is used for the preparation of the polymer is preferably selected from the group including dicarboxylic acids and their activated derivatives, diisocyanates and activated carbonic acid derivatives. Activated dicarboxylic acids are understood as meaning those derivatives which have high reactivity with respect to nucleophilic attack. Examples of such activated dicarboxylic acids are acid chlorides, acid anhydrides and esters. Examples of activated carbonic acid derivatives are phosgene or activated dicarbonates, such as, for example, dicarbonylimidazoles, di-p-nitrophenyl carbonates or bis(trichlorophenyl)carbonates.

A compound which carries at least two nucleophilic groups is used as a reactant of the first monomer. The second monomer is particularly preferably selected from the group including diols and diamines.

As a result of the reaction of the abovementioned first and second monomers, different types of polymers can be prepared. Polyesters are obtainable by the reaction of dicarboxylic acids with diols, while polyamides are obtained by the reaction with diamines. Polyurethanes and polyureas can be prepared by the reaction of diisocyanates with diols and diamines, respectively. Polycarbonates and likewise polyurethanes are obtained from activated carbonic acid derivatives. Analogous compounds can also be obtained from corresponding monomers which are at least bifunctionally substituted, i.e. include a nucleophilic substituent and a substituent which can be subjected to nucleophilic attack.

The synthesis of polycarbonates using carbonyldiimidazole is described below. The radical $R^x$ represents an alkyl, aryl or cycloalkyl radical which may also be completely or partly fluorinated or substituted by fluoroalkyl groups. In order to modify the properties of the polymer, mixtures of different monomers can also be used for the polycondensation.

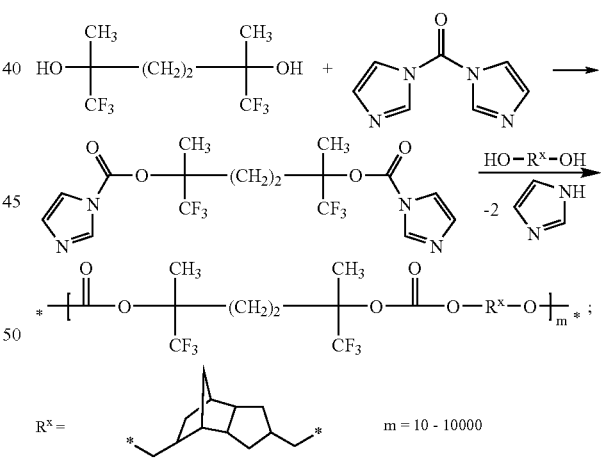

The polymer is particularly preferably polycarbonate or a polyester.

According to the invention, at least one of the monomers used for the preparation of the polymer is completely or partly fluorinated and/or carries one or more fluoroalkyl substituents, in order to increase the transparency of the polymer to light of short wavelength.

For the preparation of at least partly fluorinated polyesters or polyamides, the first monomer is preferably selected from the group including tetrafluoroterephthalic acid, tetrafluorophthalic acid, terefluoroisophthalic acid and activated derivatives thereof. For example, an acid chloride can be used as the activated derivative.

For the preparation of polycarbonates, bis(trifluoroisopropanol)- and bis(hexafluoroisopropanol)-substituted aliphatic, cycloaliphatic and aromatic compounds are particularly preferred, at least one of the hydroxyl groups being in the form of an activated carbonic acid ester. For example, a dicarbonylimidazole can be used as the activated derivative.

If a diol is used as the second monomer, this is preferably likewise completely or partly fluorinated and therefore has one or more fluoroalkyl substituents.

If the polymer is in the form of a polyester or polycarbonate, the alcohol component, preferably a diol, preferably has a composition such that at least one of the hydroxyl groups of the alcohol component, in particular of the diol, is bonded to a tertiary carbon atom and at least one further carbon atom which carries at least one hydrogen atom is bonded to the tertiary carbon atom. The carbonate or ester groups in the main chain of the polymer can then be very easily cleaved under the catalytic action of acid, it being possible to increase the reaction rate of the cleavage of the main chain of the polymer by heating the exposed photoresist in a baking step following the exposure. The cleavage of the main chain is effected according to the following reaction scheme, only the essential segments in the main chain of the polymer being shown for simplicity.

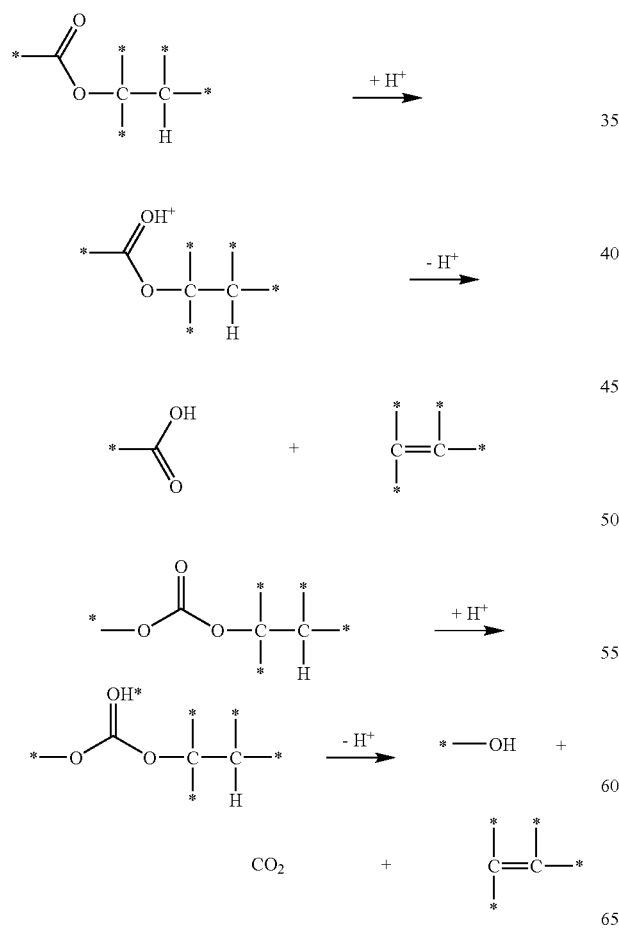

Particularly preferred second monomers are represented by formula I.

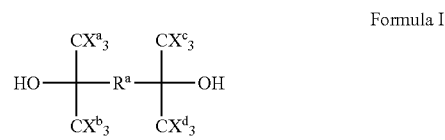

Formula I

There, $R^a$ represents a divalent alkyl group, a divalent cycloalkyl group, a divalent phenyl or biphenyl group, or

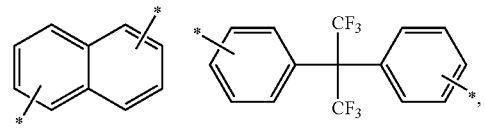

wherein it is also possible for one or more hydrogen atoms in the group $R^a$ to be replaced by a fluorine atom or a fluoroalkyl group, and $X^a$, $X^b$, $X^c$ and $X^d$, in each case independently of one another, represent a hydrogen or a fluorine atom.

The alkyl group preferably includes 1 to 10 carbon atoms, the cycloalkyl radical 5 to 20 carbon atoms and the fluoroalkyl group of the group $R^a$ preferably 1 to 10 carbon atoms.

Particularly preferred second monomers are shown below:

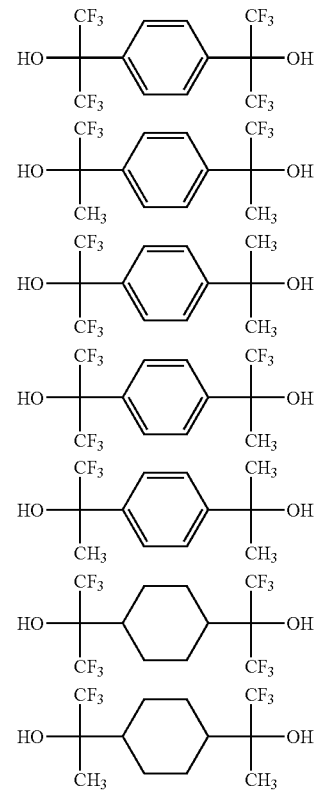

-continued

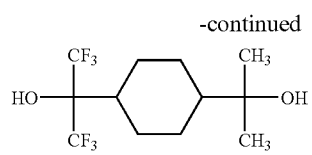

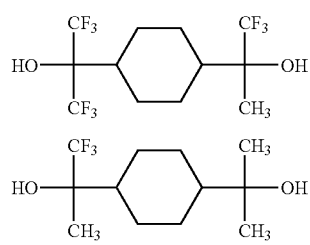

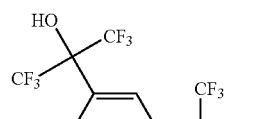

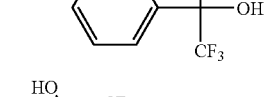

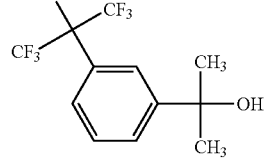

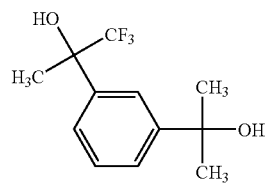

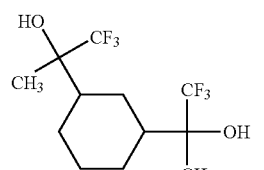

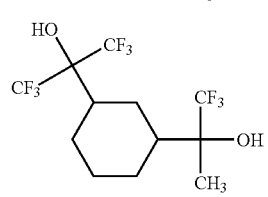

First monomers which carry activated substituents can be produced from the diols. The first monomers can be represented by the following general formulae:

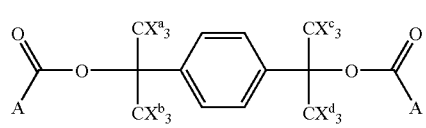

-continued

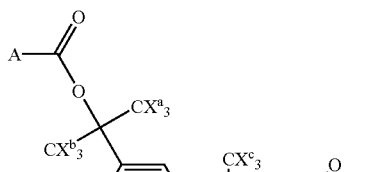

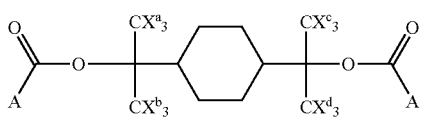

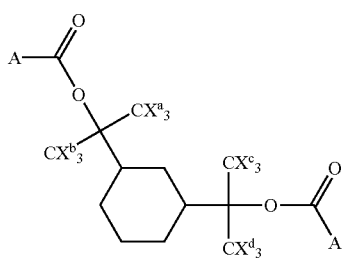

$X^a$, $X^b$, $X^c$ and $X^d$, in each case independently of one another, representing a hydrogen or fluorine atom, and A representing an activating group. A may be, for example:

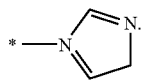

Particularly preferred asymmetrical monomers are shown below:

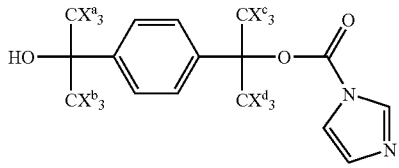

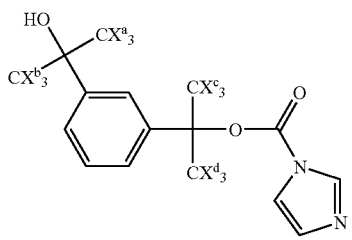

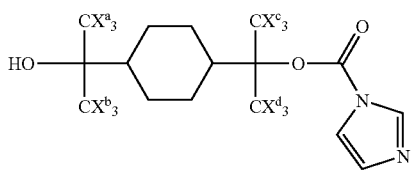

-continued

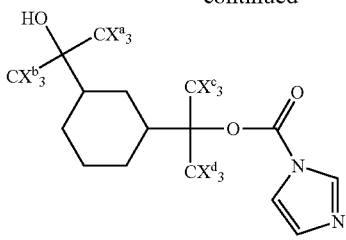

$X^a$, $X^b$, $X^c$, $X^d$ and A in each case having the abovementioned meaning.

Owing to the phenyl group or the cyclohexyl group, these monomers impart high etching resistance to the polymer. Among the diols shown, those which carry a methyl group on at least one of the tertiary carbon atoms are particularly preferred.

In addition to the diols shown, triols and their activated derivatives, preferably bisactivated triols, can also be used as a first or second monomer. The reaction is preferably carried out in such a way that only two of the hydroxyl groups are contained in the main chain of the polymer, i.e. the polymer is linear. The third hydroxyl group increases the solubility of the cleavage products in aqueous polar developers in the exposed parts. In the unexposed parts, the third hydroxyl group is then available as an anchor group for further modification of the polymer, i.e. in an amplification reaction. Preferred monomers or triols which can be used as precursors of monomers are represented below by the general formula II.

Formula II

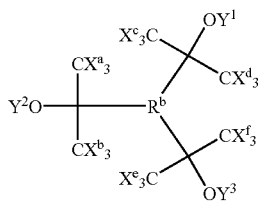

$R^b$ representing a trivalent alkyl core, a trivalent cycloalkyl core or a trivalent phenyl or biphenyl core, or

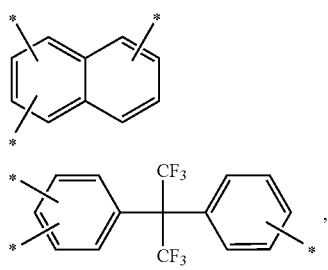

wherein it is also possible for one or more hydrogen atoms in the core $R^b$ to be replaced by a fluorine atom or a fluoroalkyl group.

The alkyl core preferably includes 1 to 10 carbon atoms, the cycloalkyl core 5 to 20 carbon atoms and the fluoroalkyl group of the core $R^a$ preferably 1 to 10 carbon atoms. $X^a$, $X^b$, $X^c$, $X^d$ $X^e$ and $X^f$, in each case independently of one another, represent a hydrogen or fluorine atom, and $Y^1$, $Y^2$ and $Y^3$, independently of one another, represent a hydrogen atom or an activated carbonic acid ester. $Y^1$, $Y^2$ and $Y^3$ preferably have a structure

A being an activating substituent, in particular

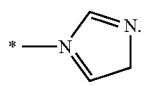

The bisactivated carbon acid derivatives of the triols are particularly preferred.

Particularly preferred triols are shown below:

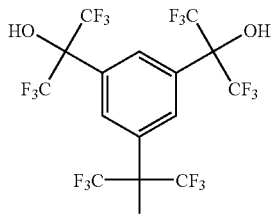

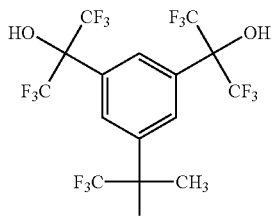

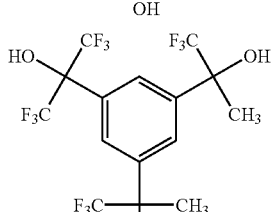

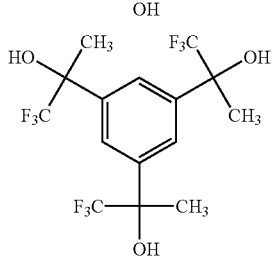

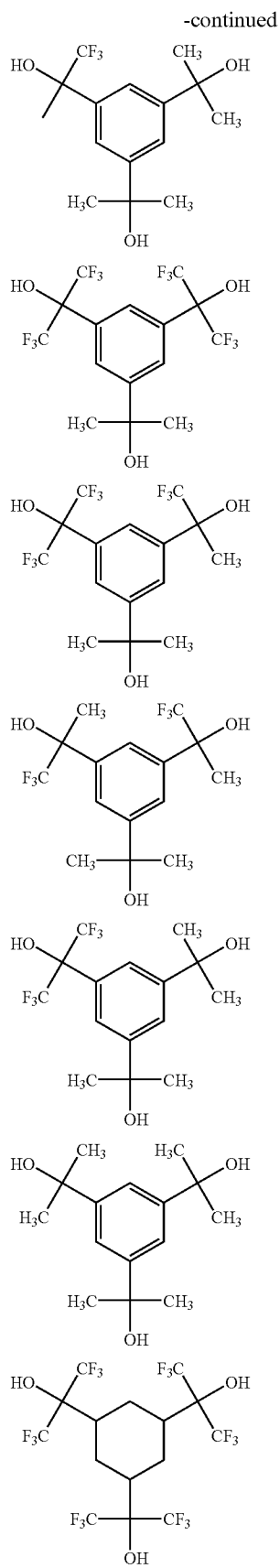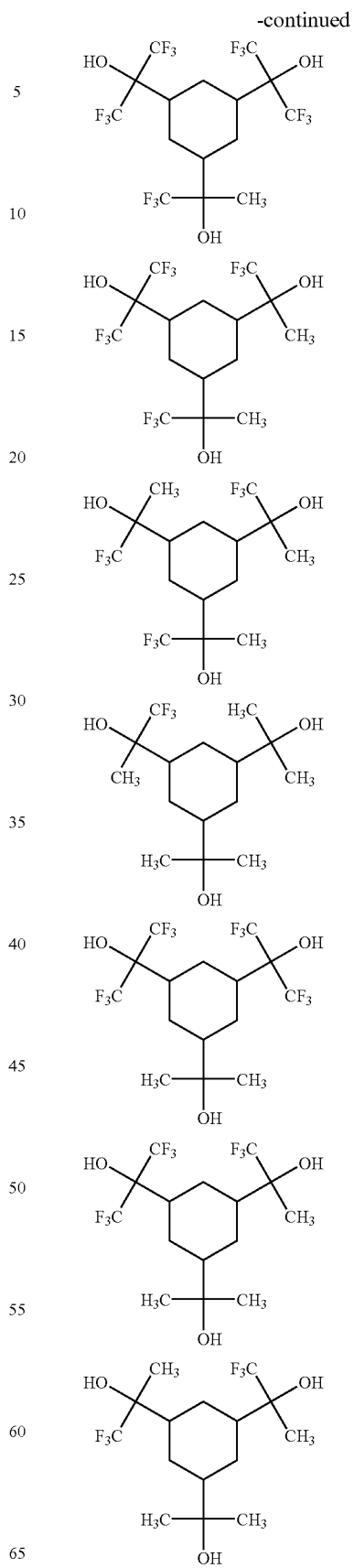

-continued

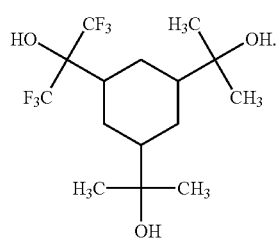

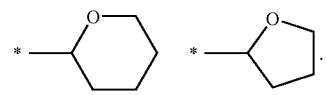

R' representing $—C^nH_{2n+1}$, with n=1–10.

Examples of particularly preferred monomers are shown below:

The activated carbonic acid derivatives are obtained by reacting one, two or three of the hydroxyl groups with a corresponding activated compound, e.g. carbonyldiimidazole. Preferably, two of the hydroxyl groups are converted into an activated carbonic acid derivative.

The cleavage of the main chain of the polymer gives rise to polar groups, so that the cleavage products already have sufficient solubility in the aqueous developer. Owing to its modular structure, the polymer contained in the photoresist according to the invention can be very exactly adapted to the requirements which are set for the photoresist. For this purpose, further comonomers can be incorporated into the polymer, in addition to the abovementioned monomers. The cleavage of the main chain may therefore also give rise to cleavage products whose solubility in the developer is no longer sufficient for achieving a clear differentiation between exposed and unexposed parts of the photoresist in acceptable processing times. In these cases, it may be advantageous if comonomers which additionally have acid-labile side groups are incorporated into the polymer by condensation. During the elimination of the acid-labile group, which generally takes place simultaneously with the cleavage of the main chain, further polar groups, such as carboxyl groups or acidic hydroxyl groups, are then liberated, with the result that the solubility of the cleavage products in aqueous alkaline developers is increased. In this embodiment, the polymer therefore has additional acid-labile side groups which, after their elimination, liberate a polar group.

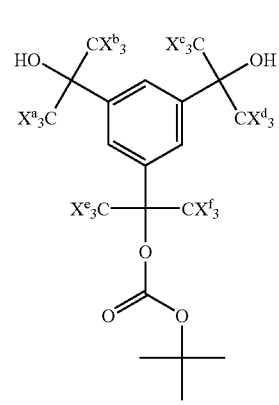

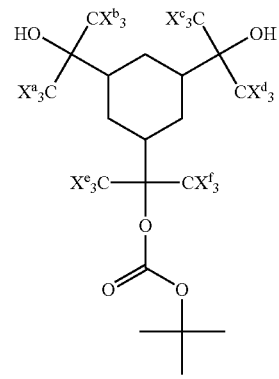

The groups known from positive photoresists can be used as acid-labile groups. Examples of suitable acid-labile groups are: tert-alkyl ester, tert-butoxycarbonyloxy, tetrahydrofuranyl, tetrahydropyranyl, tert-butyl ether, lactone or acetal groups. Tert-Butyl ester groups are particularly preferred. Exemplary comonomers are represented by the formula III:

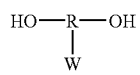

Formula III

R having the meaning stated in formula II, W representing —COOR', —OR', —OCOOR', and

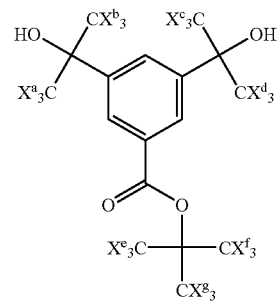

-continued

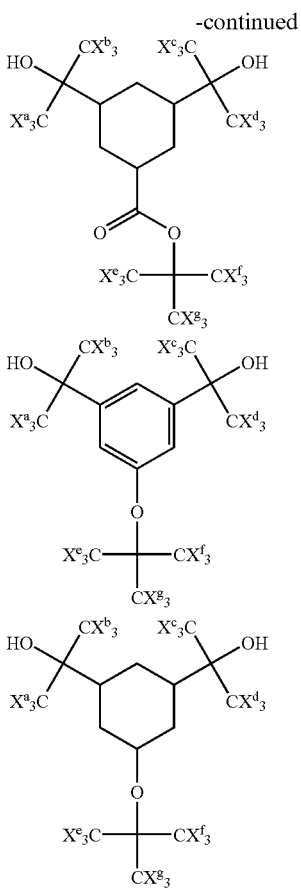

Here, $X^a$, $X^b$, $X^c$, $X^d$, $X^e$, $X^f$ and $X^g$, in each case independently of one another, represent a hydrogen or fluorine atom.

After the structuring of the photoresist, the structure produced is transferred to the substrate underneath by dry etching. The etching resistance of the resist must therefore be tailored to the plasma used. If an oxygen plasma is used, the polymer preferably includes monomer units which have silicon-containing groups. These may already be present in the polymer or may be subsequently linked to corresponding anchor groups in the polymer. The customary processes for chemical amplification, as described, for example, in Published European Patent Application No. EP 0 395 917 B1, may be used for this purpose. Monomeric compounds through the use of which silicon-containing groups can be directly incorporated into the polymer chain are shown below:

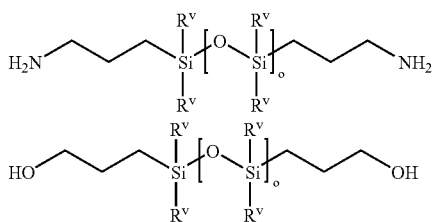

$R^v$ representing —$CH_3$, —$C_6H_5$ or —$C_6H_{11}$, and o representing an integer between 0 and 50.

In order to increase the etching resistance of the polymer to a fluorine plasma, for example, an alicyclic or aromatic monomer can be incorporated into the polymer. Suitable alicyclic monomers are, for example, fluorine- or fluoroalkyl-substituted difunctional norbornane derivatives or adamantane compounds.

Further repeating units of the polymer are shown below:

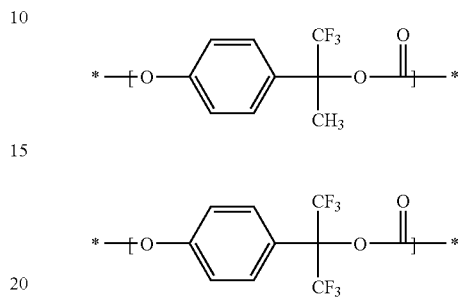

Other features which are considered as characteristic for the invention are set forth in the appended claims.

Although the invention is illustrated and described herein as embodied in a resist based on polycondensates and having an increased resolution for use in 157 nm lithography, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

DESCRIPTION OF THE PREFERRED EMBODIMENTS

The invention is explained in more detail with reference to an exemplary embodiment.

The polymer for the photoresist according to the invention is obtained by cocondensation of bis(hydroxymethyl)tricyclo [5.2.1.0$^{2.6}$] decane (10.0 g, 0.051 mol), oxalyl chloride (6.466 g, 0.051 mol), tetrafluoroterephthaloyl chloride (14.024 g, 0.051 mol) and 2,5-dihydroxy-2,5-di(trifluoromethyl)hexane (12.963 g, 0.051 mol). For this purpose, the acid chlorides are initially introduced as a solution in tetrahydrofuran (50 ml) and a solution of the alcohols in tetrahydrofuran/pyridine is added dropwise so that the temperature of the mixture does not exceed 10° C. Stirring is carried out for 12 hours at room temperature. The precipitate is separated off and the filtrate is introduced into methanol (1000 ml). A white precipitate forms. This is separated off and is further purified by reprecipitation three times from tetrahydrofuran/methanol. After drying, 27.54 g of white polymer are obtained.

The structure of the polymer is shown below. Here, p represents a number between 10 and 100.

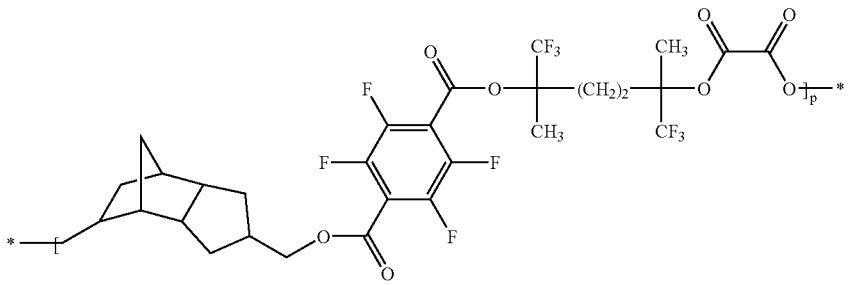

We claim:

1. A photoresist, comprising a polymer obtained by polycondensation of a first and a second monomer, said polymer having a main chain and having acid-cleavable groups in said main chain, said first monomer having at least one group selected from the group consisting of a fluorine group and a fluoroalkyl group, and said second monomer having a structure according to formula I:

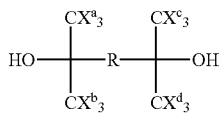
Formula I $R^a$ represents a core selected from the group consisting of a divalent alkyl core, a divalent cycloalkyl core, a divalent phenyl core, a divalent biphenyl core,

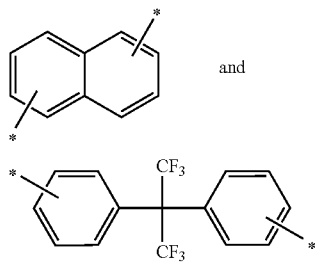
and and $X^a$, $X^b$, $X^c$ and $X^d$, in each case independently of one another, represent one of a hydrogen atom and a fluorine atom;

said second monomer being a diol, said diol having at least one group selected from the group consisting of a fluorine group and a fluoroalkyl group;

a photo acid generator; and a solvent.

2. The photoresist according to claim 1, wherein said first monomer is selected from the group consisting of a dicarboxylic acid, an activated derivative of a dicarboxylic acid, a diisocyanate and an activated carbonic acid derivative.

3. The photoresist according to claim 2, wherein said dicarboxylic acid is an acid selected from the group consisting of tetrafluoroterephthalic acid, a tetrafluorophthalic acid and a tetrafluoroisophthalic acid.

4. The photoresist according to claim 1, wherein said polymer is a polymer selected from the group consisting of a polyester and a polycarbonate.

5. The photoresist according to claim 1, wherein said first monomer is a monomer selected from the group consisting of an activated carbonic acid derivative of a bis (trifluoroisopropanol)-substituted aromatic hydroxycarboxylic acid, a bis(hexafluoroisopropanol)-substituted aromatic hydroxycarboxylic acid, an aliphatic hydroxycarboxylic acid, and a cycloaliphatic hydroxycarboxylic acid.

6. The photoresist according to claim 1, wherein:

said second monomer is a diol having a structure according to formula I:

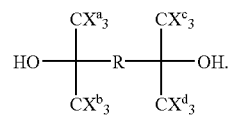
Formula I of claim 1;

in which at least one of those carbon atoms bonded to the tertiary carbon atoms carries at least one hydrogen atom which can be eliminated.

7. The photoresist according to claim 1, wherein said core $R^a$ has at least one hydrogen atom replaced by one of a fluorine atom and a fluoroalkyl group.

8. The photoresist according to claim 1, wherein said first monomer is an activated carbonic acid derivative of a diol structure according to formula I:

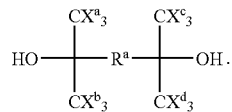
Formula I

9. The photoresist according to claim 1, wherein said first monomer is a monoactivated, carbonic acid derivative of a diol structure according to formula I:

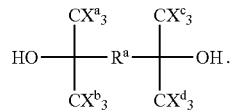
Formula I

10. The photoresist according to claim 1, wherein said first monomer is a bisactivated carbonic acid derivative of a structure according to formula I:

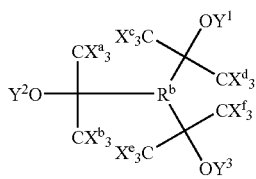

Formula I $R^b$ represents a core, $X^a$, $X^b$, $X^c$, $X^d$, $X^e$ and $X^f$, in each case independently of one another, represent one of a hydrogen atom and a fluorine atom, and $Y^1$, $Y^2$ and $Y^3$ independently of one another have a structure according to formula II or represent a hydrogen atom:

Formula II wherein A is an activating substituent.

11. The photoresist according to claim 1, wherein said polymer has acid-labile side groups such that said acid-labile side groups liberate a polar group when being eliminated.

12. The photoresist according to claim 1, wherein said polymer has silicon-containing groups.

13. A photoresist having a polymer obtained by polycondensation of a first monomer and a second monomer including a main chain, and acid-cleavable groups in said main chain, wherein at least one of said first monomer and said second monomer has a structure according to formula I:

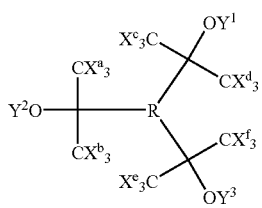

Formula I $R^b$ represents a core selected from the group consisting of a trivalent alkyl core, a trivalent cycloalkyl core, a trivalent phenyl core, a trivalent biphenyl core,

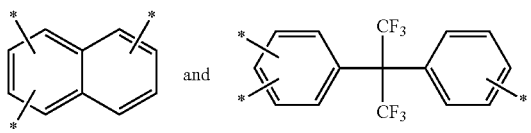

$X^a$, $X^b$, $X^c$ $X^d$, $X^e$ and $X^f$, in each case independently of one another, represent one of a hydrogen atom and a fluorine atom, and $Y^1$, $Y^2$ and $Y^3$, independently of one another, represent one of a hydrogen atom and an activated carbonic acid ester;

a photoacid generator; and a solvent.

14. The photoresist according to claim 13, wherein said core $R^b$ has at least one hydrogen atom replaced by one of a fluorine atom and a fluoroalkyl group.

15. A photoresist having a polymer obtained by polycondensation of a first monomer and a second monomer including a main chain and acid-cleavable groups in said main chain, wherein at least one of said the first monomer and said second monomer has a structure according to formula I;

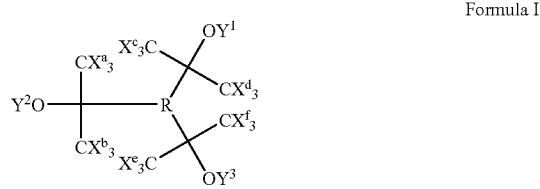

Formula I $R^b$ represents a core selected from the group consisting of a trivalent alkyl core, a trivalent cycloalkyl core, a trivalent phenyl core, a trivalent biphenyl core,

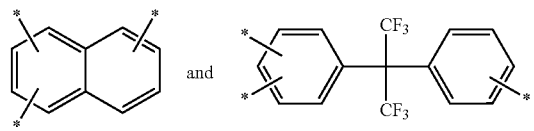

$X_a$, $X^b$, $X^c$ $X^d$, $X^e$ and $X^f$, in each case independently of one another, represent one of a hydrogen atom and a fluorine atom, and $Y^1$, $Y^2$ and $Y^3$, independently of one another, have a structure according to formula II or represent one of a hydrogen atom:

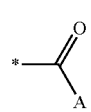

Formula II wherein A is an activating substituent;

a photoacid generator; and a solvent.

16. The photoresist according to claim 15, wherein said activating substituent has a structure according to formula III:

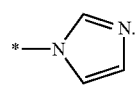

Formula III

* * * * *